United States Patent
Tseng

(10) Patent No.: US 10,673,333 B1
(45) Date of Patent: Jun. 2, 2020

(54) POWER MODULE WITH SWITCHABLE CURRENT ROUTES AND ELECTRONIC DEVICE USING SAME

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Hsiang-Pin Tseng, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/414,328

(22) Filed: May 16, 2019

(30) Foreign Application Priority Data

Mar. 1, 2019 (CN) .......................... 2019 1 0157212

(51) Int. Cl.
| | |
|---|---|
| *H02M 3/156* | (2006.01) |
| *H02M 3/158* | (2006.01) |
| *G05F 1/59* | (2006.01) |
| *H02M 1/44* | (2007.01) |
| *H03K 17/687* | (2006.01) |

(52) U.S. Cl.
CPC .............. *H02M 3/156* (2013.01); *H02M 1/44* (2013.01); *H03K 17/687* (2013.01); *G05F 1/59* (2013.01); *H02M 3/158* (2013.01); *H02M 3/1582* (2013.01)

(58) Field of Classification Search
CPC .......... G05F 1/59; H02M 3/156; H02M 3/158
USPC ................................... 323/282–286
See application file for complete search history.

(56) References Cited

U.S. PATENT DOCUMENTS

| | | | | |
|---|---|---|---|---|
| 8,564,260 | B2* | 10/2013 | Carobolante | H02M 3/1588 323/266 |
| 8,736,242 | B2* | 5/2014 | Zou | H02M 3/1588 323/272 |
| 2010/0207455 | A1* | 8/2010 | Erickson, Jr. | G05F 1/67 307/82 |
| 2015/0188304 | A1* | 7/2015 | Zhou | H02H 3/20 307/130 |
| 2016/0072387 | A1* | 3/2016 | Schmalnauer | H02M 3/158 323/271 |

* cited by examiner

*Primary Examiner* — Gary A Nash
(74) *Attorney, Agent, or Firm* — ScienBiziP, P.C.

(57) ABSTRACT

A power module with current rerouting across a printed circuit board (PCB) for decreasing electromagnetic interference and signal degradation is applied in an electronic device. The power module includes the PCB, a switch control chip, a switch circuit, a filtering circuit, a first switch, a second switch, and a control unit. The PCB includes a powered copper area, a first ground copper area, and a second ground copper area. When in the S3, S4, or S5 state and a voltage output terminal is disabled, the control unit turns off the first switch and turns on the second switch, to couple the powered copper area to the second ground copper area. When the voltage output terminal is enabled, the control unit reverses the on and off operations to enable the voltage output terminal to output a voltage.

8 Claims, 4 Drawing Sheets

POWER MODULE WITH SWITCHABLE CURRENT ROUTES AND ELECTRONIC DEVICE USING SAME

FIELD

The subject matter herein generally relates to devices supplying power.

BACKGROUND

A plurality of electronic devices can be powered by a switched power supply. Transistors powered by the switched power supply may be switched frequently, which may cause noise and electromagnetic interference, affecting other operating components. In the layout of a circuit board of the switching power supply, copper areas and ground areas carrying current are based on a circuit diagram and are fixed. When components are installed, the noise and the electromagnetic interference generated by the switched power supply may be reinforced or magnified.

BRIEF DESCRIPTION OF THE DRAWINGS

Implementations of the present technology will now be described, by way of embodiment only, with reference to the attached figures.

DETAILED DESCRIPTION

Figure 1:
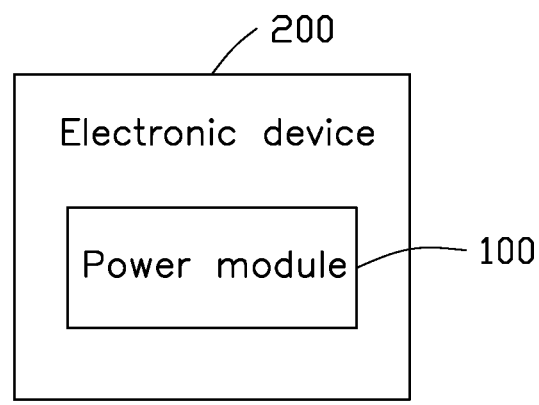
FIG. 1 is a block diagram of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates an electronic device 200 in accordance with an embodiment. The electronic device 200 comprises a power module 100, the power module 100 is configured to supply power to the electronic device 200.

In one embodiment, the electronic device 200 can be a computer, a server, a switch, etc.

Figure 2:
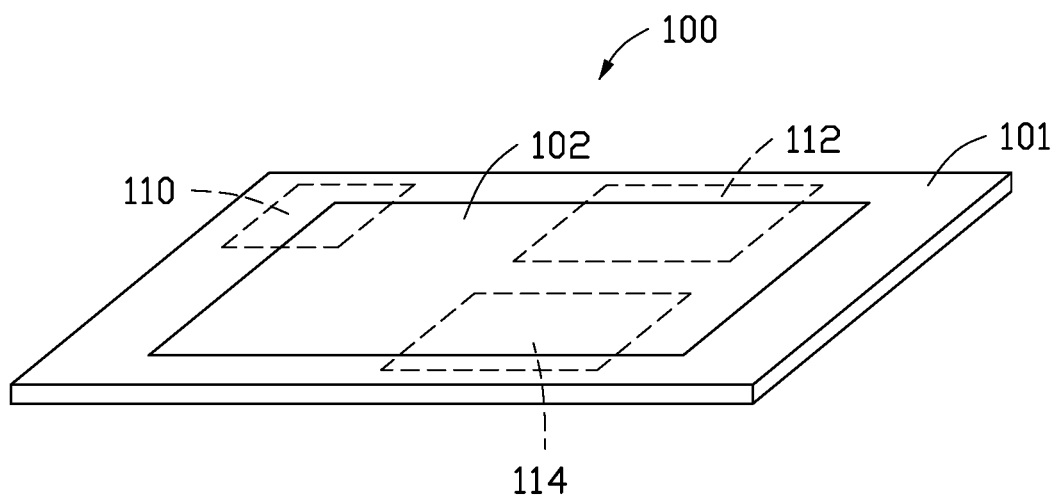
FIG. 2 is a structure diagram of a power module of the electronic device of FIG. 1 in one embodiment.

Referring to FIG. 2, the power module 100 comprises a printed circuit board (PCB) 101 and a function unit 102 set on the PCB 101. The PCB 101 comprises a power copper area 110, a first ground copper area 112, and a second ground copper area 114.

As shown in FIG. 2, the function unit 102 is set on an upper surface of the PCB 101. The copper area 110, the first ground copper area 112, and the second ground copper area 114 are set on a lower surface of the PCB 101. In other embodiments, elements of the function unit 102 can be set on the lower surface of the PCB 101, or can be set on both the lower surface and the upper surface of the PCB 101. The copper area 110, the first ground copper area 112, and the second ground copper area 114 also can be set on the upper surface of the PCB 101.

Figure 3:
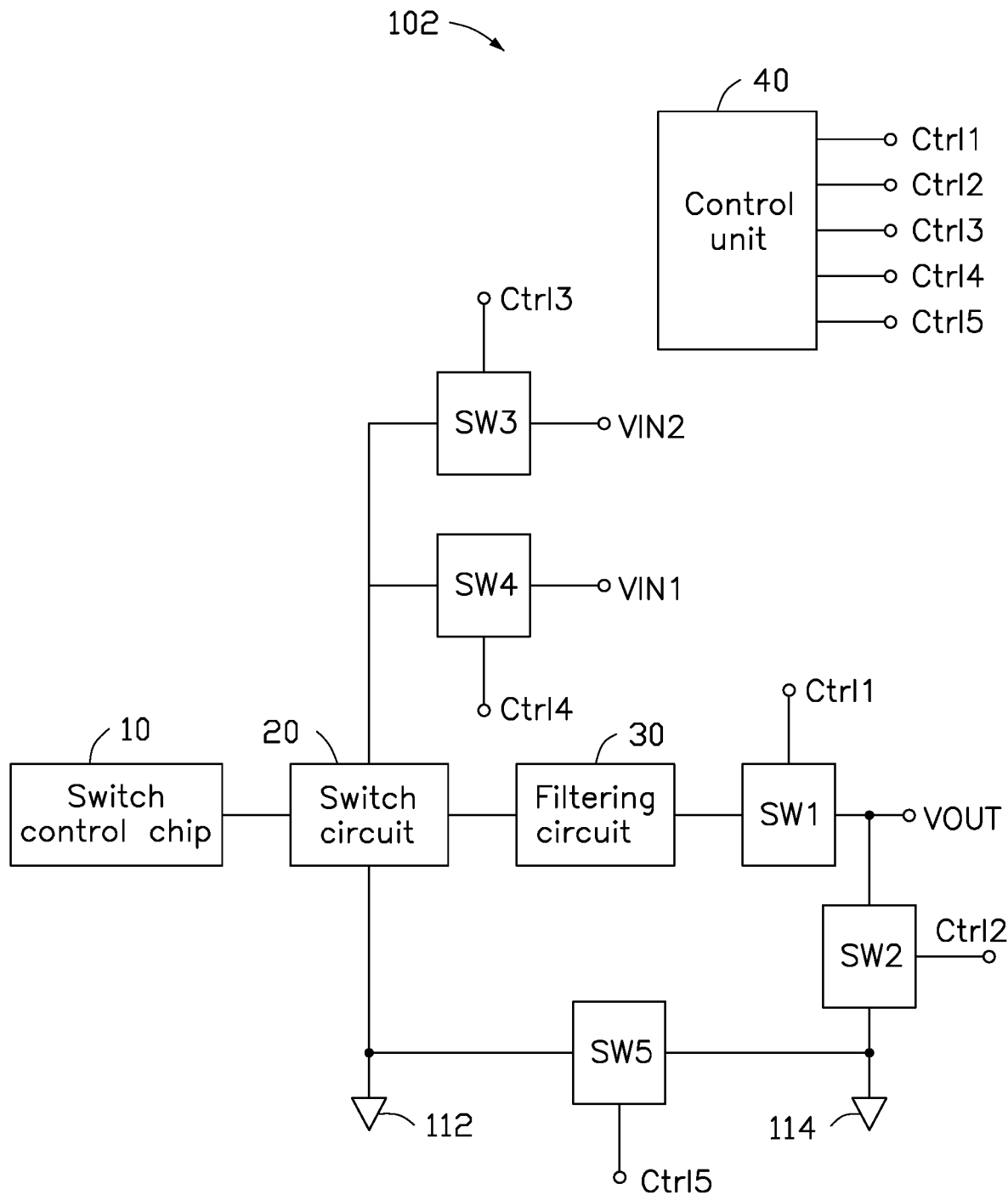
FIG. 3 is a block diagram of a function unit of the electronic device of FIG. 1 in one embodiment.

Referring to FIG. 3, the function unit 102 comprises a switch control chip 10, a switch circuit 20, a filtering circuit 30, a first switch SW1, a second switch SW2, a third switch SW3, a fourth switch SW4, a fifth switch SW5, and a control unit 40. The switch circuit 20 is coupled to a first voltage input terminal VIN1 and the switch control chip 10, and the switch circuit 20 receives and converts a voltage of the first voltage input terminal VIN1. The switch control chip 10 can turn the switch circuit 20 on and off to convert the voltage of the first voltage input terminal VIN1. The filtering circuit 30 is coupled to the switch circuit 20 and a voltage output terminal VOUT, and the filtering circuit 30 can filter a voltage outputted by the switch circuit 20. The voltage output terminal VOUT outputs an operating voltage filtered by the filtering circuit 30.

The switch circuit 20 is coupled to the first ground copper area 112 and the switch circuit 20 is grounded through the first ground copper area 112. The filtering circuit 30 is coupled to the second ground copper area 114 and the filtering circuit 30 is grounded through the second ground copper area 114. The voltage output terminal VOUT is coupled to the power copper area 110. A first terminal of the first switch SW1 is coupled to the filtering circuit 30, a second terminal of the first switch SW1 is coupled to the voltage output terminal VOUT, and a control terminal of the first switch SW1 is coupled to the control unit 40. A first terminal of the second switch SW2 is coupled to the voltage output terminal VOUT, a second terminal of the second switch SW2 is coupled to the second ground copper area 114, and a control terminal of the second switch SW2 is coupled to the control unit 40.

In one embodiment, when the electronic device 200 operates in states of advance configuration and ACPI power interfaces (these states being S3, S4, or S5), the voltage output terminal VOUT is disabled, the control unit 40 controls the first switch SW1 to be turned off and the second switch SW2 to be turned on. This enables coupling of the power copper area 110 to the second ground copper area 114. Heat dissipation of the power module 100 can thereby be improved and quality of data signals around the power module 100 is also improved. When the voltage output terminal VOUT is enabled, the control unit 40 controls the first switch SW1 to be turned on and the second switch SW2 to be turned off, to enable the voltage output terminal VOUT to output an operating voltage.

A first terminal of the third switch SW3 is coupled to the switch circuit 20, a second terminal of the third switch SW3 is coupled to a second voltage input terminal VIN2, and a control terminal of the third switch SW3 is coupled to the control unit 40. A first terminal of the fourth switch SW4 is coupled to a node between the switch circuit 20 and the third switch SW3, a second terminal of the fourth switch SW4 is coupled to the first voltage input terminal VIN1, and a control terminal of the fourth switch SW4 is coupled to the control unit 40.

In one embodiment, a value of voltage of the first voltage input terminal VIN1 can be 19V and a value of the second voltage input terminal VIN2 can be 12V. When the electronic device 200 operates in S0, S1, or S2 state, the control unit 40 controls the third switch SW3 to be turned off and the fourth switch SW4 to be turned on. The switch circuit 20 then converts the 19V of the first voltage input terminal VIN1. When the electronic device 200 operates in the S3, S4, or S5 state, the control unit 40 controls the third switch SW3 to be turned on and the fourth switch SW4 to be turned off, and the switch circuit 20 then converts the 12V of the second voltage input terminal VIN2.

In one embodiment, the power module 100 can switch input voltages of the voltage input terminals VIN1 and VIN2 through the third switch SW3 and the fourth switch SW4 based on different states of the electronic device 200, to improve power efficiency.

In one embodiment, when the electronic device 200 operates in the S3, S4, or S5 state and the second voltage input terminal VIN2 is disabled, the control unit 40 controls the third switch SW3 to be turned off and the fourth switch SW4 to be turned on. The switch circuit 20 converts the 19V of the first voltage input terminal VIN2 to enable the voltage output terminal VOUT to output an operating voltage.

A first terminal of the fifth switch SW5 is coupled to the first ground copper area 112, a second terminal of the fifth switch SW5 is coupled to the second ground copper area 114, and a control terminal of the fifth switch SW5 is coupled to the control unit 40. When electromagnetic interference (EMI) of the electronic device 200 exceeds a predetermined standard or a quality of signals of the electronic device 200 does not meet a predetermined requirement, the control unit 40 controls the fifth switch SW5 to be turned on.

In one embodiment, the control unit 40 can be a processing chip of the electronic device 200. For example, the control unit 40 can be a central processing unit (CPU), a microcontroller unit (MCU), a programable logic device (PLD), or an advanced RISC machine (ARM) processor.

Figure 4:
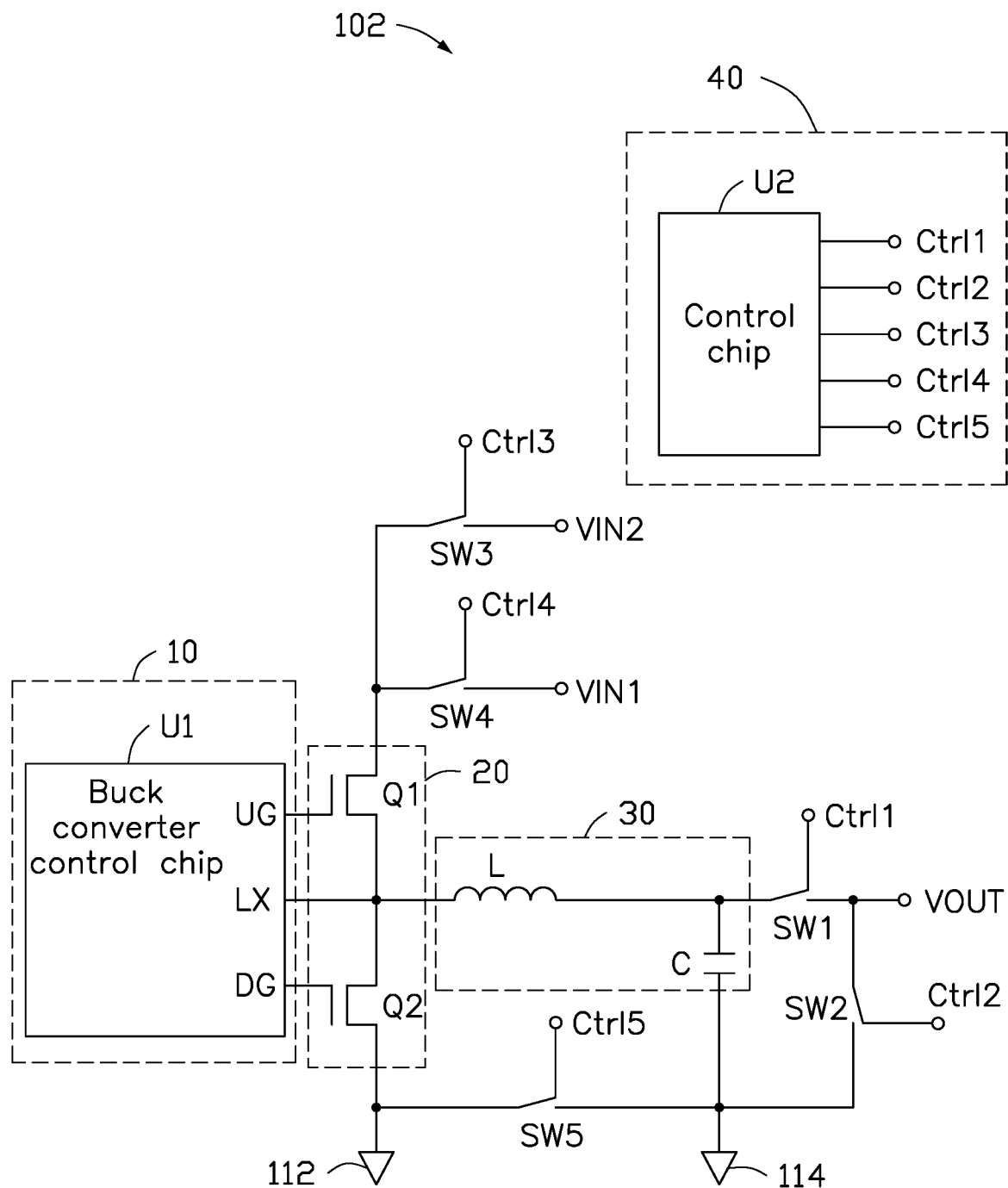
FIG. 4 is a circuit diagram of the function unit of FIG. 3.

Referring to FIG. 4, the switch control chip 10 can be a buck converter control chip (chip U1). The switch circuit 20 can comprises a first converting switch Q1 and a second converting switch Q2. A first terminal of the first converting switch Q1 is coupled to the first terminal of the third switch SW3 and the first terminal of the fourth switch SW4, a second terminal of the first converting switch Q1 is coupled to a first terminal of the second converting switch Q2, and a control terminal of the first converting switch Q1 is coupled to a first signal terminal UG of the chip U1. A second terminal of the second converting switch Q2 is grounded (through the first ground copper area 112) and a control terminal of the second converting switch Q2 is coupled to a second signal terminal DG of the chip U1.

The filtering circuit comprises an inductor L and a capacitor C. A first terminal of the inductor L is coupled to the second terminal of the first converting switch Q1, the first terminal of the second converting switch Q2, and a third signal terminal LX of the chip U1. A second terminal of the inductor L is coupled to the first terminal of the first switch SW1 and a first terminal of the capacitor C. A second terminal of the capacitor C is grounded (through the second ground copper area 114). The second terminal of the first switch SW1 is coupled to the voltage output terminal VOUT and the first terminal of the second switch SW2. The second terminal of the second switch SW2 is coupled to the second terminal of the capacitor C, the second terminal of the third switch SW3 is coupled to the second voltage input terminal VIN2, and the second terminal of the fourth switch SW4 is coupled to the first voltage input terminal VIN1. The first terminal of the fifth switch SW5 is coupled to the second terminal of the second converting switch Q2 and the second terminal of the fifth switch SW5 is coupled to the second terminal of the capacitor C.

The control unit 40 comprises a control chip U2. The control chip U2 comprises five signal terminals, Ctrl1, Ctrl2, Ctrl3, Ctrl4, and Ctrl5. The five signal terminals Ctrl1~Ctrl5 of the control chip U2 are respectively coupled to control terminals of the five switches SW1~SW5. For example, the signal terminal Ctrl1 of the control chip U2 is coupled to the control terminal of the first switch SW1, and the signal terminal Ctrl5 of the control chip U2 is coupled to the control terminal of the fifth switch SW5.

In one embodiment, the first converting switch Q1 and the second converting switch Q2 can be field effect transistors. The first switch SW1, the second switch SW2, the third switch SW3, the fourth switch SW4, and the fifth switch SW5 can be NPN transistors, PNP transistors, field effect transistors, or switch modules.

The embodiments shown and described above are only examples. Many details known in the field are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A power module applied in an electronic device, the power module comprising:
   a printed circuit board (PCB) comprising a power copper area, a first ground copper area, and a second ground copper area;
   a switch control chip;
   a switch circuit coupled to a first voltage input terminal, the first ground copper area and the switch control chip;
   a filtering circuit coupled to a voltage output terminal and the second ground copper area, and the voltage output terminal coupled to the power copper area;
   a first switch, a first terminal of the first switch coupled to the filtering circuit, and a second terminal of the first switch coupled to the voltage output terminal;
   a second switch, a first terminal of the second switch coupled to the voltage output terminal, and a second terminal of the second switch coupled to the second ground copper area; and
   a control unit coupled to a control terminal of the first switch and a control terminal of the second switch;
   wherein when the electronic device operates in S3, S4, or S5 state and the voltage output terminal is disabled, the control unit controls the first switch to be turned off and the second switch to be turned on to enable the power copper area coupled to the second ground copper area; when the voltage output terminal is enabled, the control unit controls the first switch to be turned on and the second switch to be turned off to enable the voltage output terminal to output an operating voltage.

2. The power module of claim 1, wherein the filtering circuit comprises:
   an inductor, a first terminal of the inductor coupled to the switch circuit, and a second terminal of the inductor coupled to the first terminal of the first switch; and
   a capacitor, a first terminal of the capacitor coupled to the second terminal of the inductor, and a second terminal of the capacitor coupled to the second ground copper area.

3. The power module of claim 1, further comprising:
   a third switch, a first terminal of the third switch coupled to the switch circuit, a second terminal of the third switch coupled to a second voltage input terminal, and a control terminal of the third switch coupled to the control unit; and
   a fourth switch, a first terminal of the fourth switch coupled to the first terminal of the third switch, a second terminal of the fourth switch coupled to the first voltage input terminal, and a control terminal of the fourth switch coupled to the control unit;
   wherein when the electronic device operates in S0, S1, or S2 state, the control unit controls the third switch to be turned off and the fourth switch to be turned on.

4. The power module of claim 3, wherein when the electronic device operates in the S3, S4 or S5 state, the control unit controls the third switch to be turned on and the fourth switch to be turned off.

5. The power module of claim 3, wherein a value of voltage of the first voltage input terminal is 19 V and a value of voltage of the second voltage input terminal is 12 V.

6. The power module of claim 3, wherein when the electronic device operates in the S3, S4, or S5 state and the second voltage input terminal is in an available state, the control unit controls the third switch to be turned on and the fourth switch to be turned off; and when the electronic device operates in the S3, S4, or S5 state and the second voltage input terminal is in an unavailable state, the control unit controls the third switch to be turned off and the fourth switch to be turned on.

7. The power module of claim 1, further comprising:
   a fifth switch, a first terminal of the fifth switch coupled to the first ground copper area, a second terminal of the fifth switch coupled to the second ground copper area, and a control terminal of the fifth switch coupled to the control unit;
   wherein when electro magnetic interference (EMI) of the electronic device exceeds a predetermined standard or a quality of signals of the electronic device does not meet a predetermined requirement, the control unit controls the fifth switch to be turned on.

8. The power module of claim 1, wherein the control unit is a central processing unit (CPU), a microcontroller unit (MCU), a programable logic device (PLD), or an advanced RISC machine (ARM) processor.

* * * * *